(12) United States Patent
Gebuhr et al.

(10) Patent No.: US 9,673,136 B2
(45) Date of Patent: Jun. 6, 2017

(54) HOUSING ARRANGEMENT, METHOD OF PRODUCING A HOUSING AND METHOD OF PRODUCING AN ELECTRONIC ASSEMBLY

(71) Applicant: OSRAM Opto Semiconductors GmbH, Regensburg (DE)

(72) Inventors: Tobias Gebuhr, Regensburg (DE); Thomas Schwarz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/424,539

(22) PCT Filed: Aug. 28, 2013

(86) PCT No.: PCT/EP2013/067777
§ 371 (c)(1),
(2) Date: Feb. 27, 2015

(87) PCT Pub. No.: WO2014/033152
PCT Pub. Date: Mar. 6, 2014

(65) Prior Publication Data
US 2015/0228562 A1    Aug. 13, 2015

(30) Foreign Application Priority Data

Aug. 29, 2012 (DE) .................. 10 2012 215 285

(51) Int. Cl.
*H01L 21/56* (2006.01)
*H01L 23/495* (2006.01)
(Continued)

(52) U.S. Cl.
CPC .... *H01L 23/49541* (2013.01); *H01L 21/4842* (2013.01); *H01L 21/565* (2013.01);
(Continued)

(58) Field of Classification Search
CPC ................... H01L 25/0753; H01L 2933/0033
(Continued)

(56) References Cited

U.S. PATENT DOCUMENTS 5,948,991 A   9/1999   Nomura et al.
5,986,316 A   11/1999  Toyoda et al.
(Continued)

FOREIGN PATENT DOCUMENTS

DE   10018404 A1   10/2000
EP   0398108 A1    11/1990
WO   2008/038937 A1   4/2008

*Primary Examiner* — Hung V Ngo
(74) *Attorney, Agent, or Firm* — DLA Piper LLP (US)

(57) ABSTRACT

A housing arrangement includes a plurality of interconnected housings for electronic components, each housing including a leadframe section of a leadframe, wherein the leadframe section is formed from an electrically conductive material and has a receiving region that receives the electronic component and/or a contact region that contacts the electronic component, a molding material into which the leadframe section is embedded and which has at least one receiving opening in which the receiving region and/or the contact region are exposed, and at least one stress reduction opening formed in the molding material and free of the receiving region and/or the contact region, wherein the housings connect to one another via the leadframe and the molding material, the stress reduction openings are formed at transitions from in each case one of the housings to another of the housings.

10 Claims, 9 Drawing Sheets

(51) Int. Cl.
  *H01L 33/48* (2010.01)
  *H01L 21/48* (2006.01)
  *H01L 23/31* (2006.01)
  *H01L 25/075* (2006.01)

(52) U.S. Cl.
  CPC .... *H01L 23/3157* (2013.01); *H01L 23/49503* (2013.01); *H01L 33/486* (2013.01); *H01L 25/0753* (2013.01); *H01L 2924/0002* (2013.01); *H01L 2933/0033* (2013.01); *Y10T 29/49158* (2015.01)

(58) Field of Classification Search
  USPC ........................................................ 257/669
  See application file for complete search history.

(56) References Cited

U.S. PATENT DOCUMENTS

| | | | |
|---|---|---|---|
| 6,130,473 A * | 10/2000 | Mostafazadeh | H01L 21/561 257/666 |
| 6,521,966 B1 | 2/2003 | Ishio et al. | |
| 7,524,087 B1 | 4/2009 | Aizar et al. | |
| 7,662,672 B2 * | 2/2010 | Lin | H01L 21/4828 257/666 |
| 2011/0233744 A1 * | 9/2011 | Chow | H01L 21/561 257/669 |
| 2011/0241028 A1 | 10/2011 | Park et al. | |

* cited by examiner

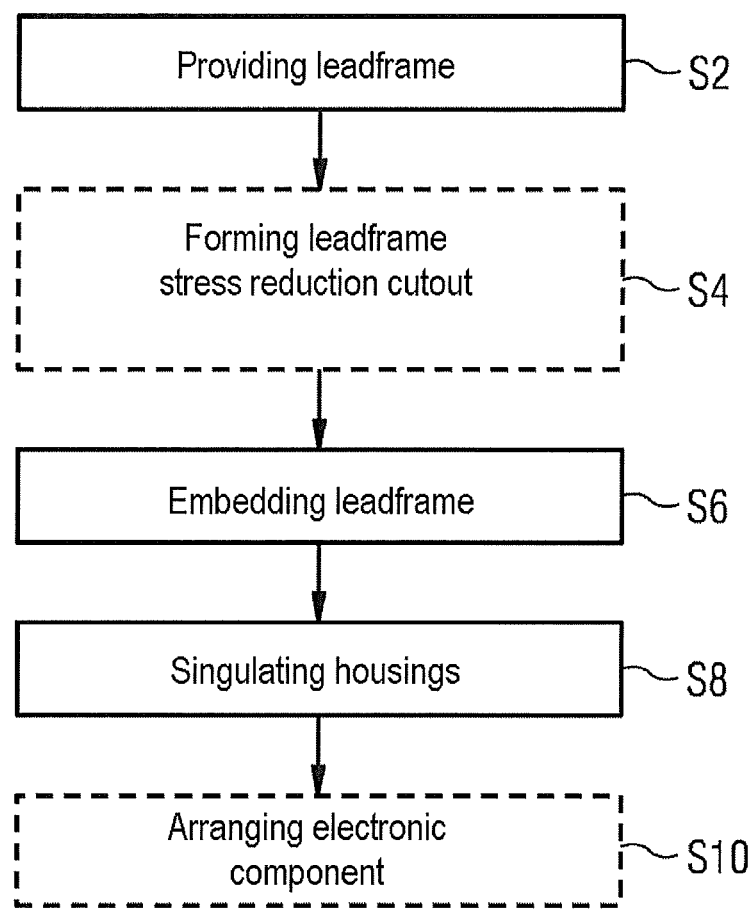

HOUSING ARRANGEMENT, METHOD OF PRODUCING A HOUSING AND METHOD OF PRODUCING AN ELECTRONIC ASSEMBLY

TECHNICAL FIELD

This disclosure relates to a housing arrangement with a housing for an electronic component. The disclosure also relates to a method of producing a housing and a method of producing an electronic assembly.

BACKGROUND

Known housings for electronic components, for example, QFN (quad flat no leads) housings comprise leadframe sections, for example, as basic material. The QFN housings are also designated as QFN packages and/or as micro leadframe (MLF) and are known in electronics as a chip housing design for integrated circuits (IC). The designation "QFN" encompasses different sizes of IC housings which can all be soldered as surface-mounted devices on printed circuit boards. The designation "QFN" is also used as representative of the following designations: MLPQ (Micro Leadframe Package Quad), MLPM (Micro Leadframe Package Micro), MLPD (Micro Leadframe Package Dual), DRMLF (Dual Row Micro Leadframe Package), DFN (Dual Flat No-lead Package), TDFN (Thin Dual Flat No-lead Package), UTDFN (Ultra Thin Dual Flat No-lead Package), XDFN (eXtreme thin Dual Flat No-lead Package), QFN-TEP (Quad Flat No-lead package with Top Exposed Pad), TQFN (Thin Quad Flat No-lead Package), VQFN (Very Thin Quad Flat No Leads Package). As an essential feature and in contrast to the similar Quad Flat Package (QFP) the electrical connections (Pins) do not project laterally beyond the dimensions of the plastic enclosure of the housings, but rather are integrated in the form of non-tin-plated copper connections into the underside of the housing in a planar fashion, which copper connections can be formed, for example, by the undersides of the leadframe sections. As a result, the required space on the printed circuit board can be reduced and a higher packing density can be achieved. Furthermore, a particularly good heat dissipation toward the printed circuit board can be ensured.

The leadframe sections are singulated from leadframes. The leadframes comprise, for example, an electrically conductive material, for example, copper or are formed therefrom. The leadframe sections serve, for example, to mechanically fix and/or electrically contact electronic components such as, for example, chips, for example, semiconductor chips and/or components that emit electromagnetic radiation. For this purpose, the leadframe sections have, for example, receiving regions that receive the electronic components and/or contact regions to electrically contact the electronic components.

During production of the housings, the leadframes are embedded into a molding material, for example, in a molding method, for example, an injection molding or transfer molding method. The molding material can be a plastic enclosure. The structure comprising molding material and the leadframe embedded therein can also be designated as a housing arrangement. The fact that the leadframes or leadframe sections are embedded into the molding material means, for example, that the leadframes or the leadframe sections are at least partly surrounded by the molding material. Parts of the leadframes can remain free of molding material, for example, at an underside of the leadframes the electrical connections that contact the housings, in particular the leadframe sections of the housings and/or, for example, at a top side of the leadframes the receiving openings in which the receiving regions and/or contact regions are exposed. The electrical contacts of the housings are formed at an opposite side of the leadframe sections relative to the receiving regions. By way of example, the electrical contacts are formed by the undersides of the leadframe sections. As a result, the finished housings can be placed onto a printed circuit board, wherein directly by the resultant physical contact between the housing and the printed circuit board it is also possible to produce the electrical contact with the leadframe section and the electronic component contacted therewith and/or a thermal coupling of the housing or of the electronic component to the printed circuit board.

During the embedding of the leadframe into the molding material, the housing assemblages formed by molding material and leadframe and/or the corresponding housings can warp, for example, on account of material shrinkage and/or on account of thermal expansion. In such warped housing assemblages and/or housings, problems can arise during subsequent processing processes. By way of example, the warped housing assemblages may be handled relatively poorly on roller conveyors, magazine inlets or outlets and/or when sucked up on a vacuum table.

One cause of bending resides, for example, in the different coefficients of thermal expansion (CTE) between the material of the leadframe and the material of the molding material which can comprise, for example, a thermosetting plastic, for example, epoxy resin, silicone resin or a thermoplastic, for example, PPA or polyester. The CTE of the molding material, above the glass transition temperature, is generally higher than that of the material of the leadframe and, below the glass transition temperature, is generally below the CTE of the material of the leadframe. On account of these differences in the coefficients of thermal expansion, the bending described above arises, for example, in a manner corresponding to the known bimetal effect.

To avoid bending of the housing arrangement and/or of the housing, it is known to use epoxy-based resins, for example, as molding material, for example, an EMC (electro mold compound), the CTEs of which below their glass transition temperature are 7 ppm/K to 12 ppm/K, for example, and to use for the material of the leadframes, for example, an FeNi alloy, for example, alloy 42 having a CTE of approximately 8 ppm/K. With the use of these materials, the warping can be kept small, but not prevented, in the case of the housing arrangement. In many applications, for example, in housings for components that emit electromagnetic radiation, however, leadframes having high thermal conductivity, for example, composed of copper may be desired.

Furthermore, in order to reduce warping it is known to reduce the thickness of the molding material on the leadframes as far as possible. Furthermore, to reduce warping it is known to form two molding material regions on a leadframe which are spaced apart from one another in the center such that the leadframe is free of molding material between the two molding material regions. Furthermore, during the subsequent processing processes, pressure rollers can be used, for example, to press the bent housing assemblages onto the corresponding transport means.

SUMMARY

We provide a housing arrangement comprising a plurality of interconnected housings for electronic components, each housing comprising a leadframe section of a leadframe, wherein the leadframe section is formed from an electrically conductive material and has a receiving region that receives the electronic component and/or a contact region that contacts the electronic component, a molding material into which the leadframe section is embedded and which has at least one receiving opening in which the receiving region and/or the contact region are exposed, and at least one stress reduction opening formed in the molding material and free of the receiving region and/or the contact region, wherein the housings connect to one another via the leadframe and the molding material, the stress reduction openings are formed at transitions from in each case one of the housings to another of the housings.

We further provide a method of producing a housing for an electronic component, wherein a leadframe section is provided, which is formed from an electrically conductive material and which has a receiving region that receives the electronic component and/or a contact region that contacts the electronic component, wherein the leadframe section is provided in an arrangement with further leadframe sections as a leadframe, the leadframe section is embedded into a molding material by the leadframe being embedded into the molding material, whereby a housing arrangement is formed, wherein at least one receiving opening in which the receiving region and/or the contact region are/is exposed is formed in the molding material for each leadframe section, and at least one stress reduction opening free of the receiving region and/or the contact region is formed in the molding material for each leadframe section, wherein the stress reduction openings are formed at transitions from one of the leadframe sections to another of the leadframe sections, a plurality of housings are singulated from the housing arrangement by the embedded leadframe sections being separated from one another.

We yet further provide a method of producing an electronic assembly, wherein the housing for an electronic component, wherein a leadframe section is provided, which is formed from an electrically conductive material and which has a receiving region that receives the electronic component and/or a contact region that contacts the electronic component, wherein the leadframe section is provided in an arrangement with further leadframe sections as a leadframe, the leadframe section is embedded into a molding material by the leadframe being embedded into the molding material, whereby a housing arrangement is formed, wherein at least one receiving opening in which the receiving region and/or the contact region are/is exposed is formed in the molding material for each leadframe section, and at least one stress reduction opening free of the receiving region and/or the contact region is formed in the molding material for each leadframe section, wherein the stress reduction openings are formed at transitions from one of the leadframe sections to another of the leadframe sections, a plurality of housings are singulated from the housing arrangement by the embedded leadframe sections being separated from one another is formed and the electronic component is arranged and/or contacted in the receiving opening before or after the housings are singulated from the housing arrangement.

BRIEF DESCRIPTION OF THE DRAWINGS

FIG. 20 shows a flow diagram of one example of a method of producing a housing for an electronic component and of a method of producing an electronic assembly.

DETAILED DESCRIPTION

Figure 1:
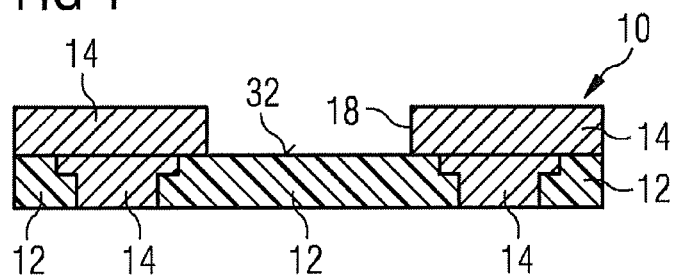
FIG. 1 shows a sectional illustration in side view of one example of a housing for an electronic component.

We provide a method of producing a housing for electronic components and a method of producing an electronic assembly which can be carried out simply and/or precisely and/or wherein bending of a housing arrangement during the production process can be reduced or prevented.

We also provide a housing arrangement with a housing for an electronic component. The housing comprises a leadframe section formed from an electrically conductive material and which has a receiving region for receiving the electronic component and/or a contact region that contacts the electronic component. The housing furthermore comprises a molding material into which the leadframe section is embedded. The molding material has at least one receiving opening in which the receiving region and/or the contact region are exposed. The molding material has at least one stress reduction opening which is free of the receiving region and/or the contact region.

During a production process of producing the housing, the stress reduction opening brings about a reduction of an effect corresponding to the bimetal effect between the molding material and the leadframe section and thus contributes to preventing or at least reducing bending of the leadframe and of the molding material. On account of the bending being prevented or reduced, subsequent processing processes can be carried out simply and precisely.

The fact that the stress reduction opening is free of the receiving region and/or the contact region means, for example, that the stress reduction opening has no other purpose than that of reducing the stress between the molding material and the leadframe and/or that in subsequent processing processes the stress reduction opening is not used for the arrangement and/or contacting of electronic components. The receiving opening can also be designated as a cavity, for example. The housing can also be designated as a mold array, for example. The electronic component can also be designated as a unit, for example. Furthermore, a plurality of electronic components can be arranged in a housing. The electronic components arranged in the receiving opening can be, for example, encapsulated with an encapsulating material and/or embedded into the encapsulating material, for example, with and/or into silicone or into silicone comprising a convertor that converts electromagnetic radiation or comprises $TiO_2$, wherein the encapsulating material can be covered, for example, partly or wholly with a black epoxy.

The housing can have, for example, two, three or more of the stress reduction openings. The housing can be formed as a QFN housing, for example. That means, for example, that the housing has no outwardly leading wires which protrude, for example, laterally from the housing and which would have to be bent downward, for example, upon the housing being arranged onto a printed circuit board, rather that the QFN housing has at its underside electrical connections formed by the leadframe section, for example, and which, upon the QFN housing being placed onto the printed circuit board, bring about both a mechanical and an electrical coupling of the QFN housing and, by the leadframe section, also an electrical coupling of the electronic component arranged therein to the printed circuit board. Furthermore, the physical contact between the housing and the printed circuit board and the associated thermal coupling of the housing to the printed circuit board can contribute to very good behavior in the event of loading caused by thermal cycling since the material of the printed circuit board section can be adapted particularly well to the coefficients of thermal expansion of the printed circuit board and/or of the heat sink. In this case, the printed circuit board can be, for example, an FR1, FR2, FR3, FR4, FR5, CEM1, CEM2, CEM3, CEM4 or CEM5 printed circuit board, for example, a through-contacted FR4 printed circuit board.

The stress reduction opening may be formed with a depth such that the material of the leadframe section is exposed in the stress reduction opening. This can contribute simply and effectively to a substantial reduction of the bending.

The stress reduction opening may have a groove in the molding material. The groove can contribute in a simple manner to preventing and/or reducing bending. Furthermore, the groove can be formed in a simple and/or known manner.

No receiving opening need be formed in a free region, which extends in the molding material along a direction parallel to a surface of the leadframe section and parallel to a lateral outer wall of the housing, and the stress reduction opening is formed in the free region. In other words, the stress reduction opening can be formed, for example, precisely in the free regions in which otherwise the molding material would extend from one end to the other end of the housing and in which, therefore, particularly high forces would act on the housing arrangement. This can contribute in a particularly effective manner to preventing and/or reducing the bending of the housing arrangement.

An electronic assembly may be provided which comprises a housing, for example, the housing explained above, and an electronic component. The electronic component is arranged in the receiving region of the housing and/or is electrically contacted in the contact region of the housing. The stress reduction opening is free of electronic components and/or electrical contacts. The electronic component can be, for example, a component that emits electromagnetic radiation and/or a chip, for example, a semiconductor chip. The component that emits electromagnetic radiation can be, for example, an LED and/or an OLED.

A method of producing a housing for an electronic component is provided, for example, to produce the housing explained above. In the method, a leadframe section is provided, which is formed from an electrically conductive material and which has a receiving region that receives the electronic component and/or a contact region that contacts the electronic component. The leadframe section is embedded into a molding material. At least one receiving opening in which the receiving region and/or the contact region are/is exposed is formed in the molding material. At least one stress reduction opening which is free of the receiving region and/or the contact region is formed in the molding material. The stress reduction opening can be formed, for example, in the form of a groove. Furthermore, it is also possible to form two, three or more corresponding stress reduction openings.

The stress reduction opening may be formed with a depth such that the material of the leadframe section is exposed in the stress reduction opening.

A free region may be formed in the molding material. The free region extends in the molding material along a direction parallel to a surface of the leadframe section and parallel to a lateral outer wall of the housing. In the free region no receiving opening is formed. The stress reduction opening is formed in the free region.

The leadframe section may be provided in an arrangement with further leadframe sections as a leadframe. The leadframe section is embedded into the molding material by the leadframe being embedded into the molding material. The embedded leadframe forms a housing arrangement. At least one receiving opening and at least one stress reduction opening are formed for each leadframe section. A plurality of housings are singulated from the housing arrangement by the embedded leadframe sections being separated from one another. In other words, the housing is produced by virtue of the fact that, first, the housing arrangement is produced, which comprises the leadframe embedded into the molding material, and by virtue of the fact that then the housings each having one of the leadframe sections are singulated from the housing arrangement. Separating the leadframe sections from one another can comprise, for example, cutting or sawing the housing arrangement and/or the leadframe.

The leadframe may have a long side and a short side parallel to its surface. The stress reduction openings are formed, for example, perpendicularly to the long side and/or parallel to the short side. This can contribute particularly effectively to preventing and/or reducing bending of the housing arrangement since the warping occurs substantially and/or basically along the long side and since the bend runs along the long side and can be reduced particularly effectively if the stress reduction opening is formed perpendicularly to the course of the bend.

The stress reduction openings may be formed at transitions from one of the leadframe sections to another of the leadframe sections. By way of example, each housing in the housing arrangement is defined by predefined housing boundaries. The housing boundaries can lie, for example, at the transitions and/or in transition regions at the transitions. The stress reduction openings can then be formed at the housing boundaries and/or in a manner overlapping the housing boundaries and/or in a manner lying on the housing boundaries. By way of example, the stress reduction openings are formed in regions in which the housings are intended subsequently to be separated, for example, sawed. In this case, the stress reduction openings can extend along the entire housing boundaries or only over a portion of the housing boundaries. By way of example, a plurality of stress reduction openings separated from one another by molding material can be formed along a housing boundary. By way of example, the stress reduction openings can be formed such that they correspondingly separate the molding material associated with different housings. The stress reduction openings can be formed, for example, such that they partly or completely separate the individual housings in the housing arrangement from one another, in particular the molding material of the housings.

The housings may be singulated from the housing arrangement by the individual housings being separated in the region of at least some of the stress reduction openings. This can contribute to particularly simple and/or rapid singulation of the housings since only little or no molding material at all need be severed in the region of the stress reduction openings. This can contribute to the fact that substantially only the leadframe need be severed. Separation can be effected by example by sawing or cutting the housing arrangement and/or the leadframe. By way of example, a saw blade that singulates the housings can be chosen with a width such that the corresponding saw cut has a width which corresponds or virtually corresponds to the width of the stress reduction openings. The saw blade thickness can be chosen, for example, such that the stress reduction opening is readily discernible, hardly discernible or not discernible at all in the completed housing.

A leadframe stress reduction opening may be formed in the leadframe in a region free of molding material. The leadframe stress reduction opening can be formed, for example, in the leadframe. The leadframe stress reduction opening can be formed, for example, between two large areas of molding material. The leadframe stress reduction opening can be formed, for example, along a center line that identifies a center of the long side of the leadframe and runs perpendicularly to the long side. The leadframe stress reduction opening can extend, for example, through the entire thickness of the leadframe. Just like the stress reduction opening in the molding material, the leadframe stress reduction opening in the leadframe can contribute to preventing and/or reducing the bending of the housing arrangement.

In various examples, a method of producing an electronic assembly is provided, wherein a housing is formed, for example, in accordance with the method explained above, and wherein the electronic component or components is or are arranged and/or contacted in the receiving opening before or after the housings are singulated from the housing arrangement.

Examples are illustrated in the figures and are explained in greater detail below.

In the following detailed description, reference is made to the accompanying drawings, which form part of this description and show for illustration purposes specific examples. In this regard, direction terminology such as, for instance, "at the top", "at the bottom", "at the front", "at the back", "front", "rear", and the like is used with respect to the orientation of the figure(s) described. Since component parts of examples can be positioned in a number of different orientations, the direction terminology serves for illustration and is not restrictive in any way whatsoever. Other examples can be used and structural or logical changes can be made without departing from the scope of protection of this disclosure. The features of the various examples described herein can be combined with one another, unless specifically indicated otherwise. Therefore, the following detailed description should not be interpreted in a restrictive sense, and the scope of protection is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

By way of example, an electronic component can be a component that emits electromagnetic radiation. In various examples, a component that emits electromagnetic radiation can be a semiconductor component that emits electromagnetic radiation and/or can be embedded as a diode that emits electromagnetic radiation, as an organic diode that emits electromagnetic radiation, as a transistor that emits electromagnetic radiation or as an organic transistor that emits electromagnetic radiation. The radiation can be, for example, light in the visible range, UV light and/or infrared light. In this connection, the component that emits electromagnetic radiation can be embedded, for example, as a light emitting diode (LED), as an organic light emitting diode (OLED), as a light emitting transistor or as an organic light emitting transistor. The light emitting component can be part of an integrated circuit. Furthermore, a plurality of light emitting components can be provided, for example, in a manner accommodated in a common housing.

FIG. 1 shows a sectional illustration of one example of a conventional housing 10 for an electronic component. The housing 10 can comprise, for example, a leadframe section 12 and a molding material 14. The leadframe section 12 can be embedded, for example, in the molding material 14. A receiving opening 18, for example, can be formed in the molding material 14. The receiving opening 18 serves, for example, to receive and/or contact the electronic component (see FIGS. 17 to 19). The leadframe section 12 has, for example, a receiving region that receives the electronic component and/or a contact region that contacts the electronic component. The receiving region and/or the contact region can be arranged and exposed in the receiving opening 18, for example.

The leadframe section 12 can comprise an electrically conductive material, for example. The material of the leadframe section 12 can have a particularly high electrical conductivity, for example. The material can comprise, for example, copper, for example, CuW or CuMo, copper alloys, brass, nickel and/or iron, for example, FeNi and/or can be formed therefrom, for example. The molding material 14 can comprise, for example, an inorganic material, for example, a composite material, for example, epoxy resin and/or silicone, a silicone hybrid and/or a silicone-epoxy hybrid. The thickness of the housing 10 can be, for example, 100 μm to 1 mm, for example, 200 μm to 500 μm, for example, 250 μm to 300 μm. The thickness of the leadframe section 12 can be, for example, 100 μm to 500 μm, for example, 150 μm to 300 μm.

The housing 10 is, for example, a QFN housing and/or a housing element of a QFN package, for example, of an MLPQ (Micro Leadframe Package Quad), MLPM (Micro Leadframe Package Micro), MLPD (Micro Leadframe Package Dual), DRMLF (Dual Row Micro Leadframe Package), DFN (Dual Flat No-lead Package), TDFN (Thin Dual Flat No-lead Package), UTDFN (Ultra Thin Dual Flat No-lead Package), XDFN (eXtreme thin Dual Flat No-lead Package), QFN-TEP (Quad Flat No-lead package with Top Exposed Pad), TQFN (Thin Quad Flat No-lead Package), VQFN (Very Thin Quad Flat No Leads Package) package.

The housing 10 can, for example, receive and/or contact the electronic component or two or more electronic components. The electrical contacting of the electronic component can be carried out via the leadframe section 12, for example, which at its underside (the underside in FIG. 1), for example, can be electrically and/or thermally contacted with a printed circuit board (not illustrated).

Furthermore, the housing 10 can have a very good behavior under loading caused by thermal cycling since the material of the printed circuit board section 12 can be adapted particularly well to the coefficients of thermal expansion of the printed circuit board and/or of the heat sink. In this case, the printed circuit board can be for example, an FR1, FR2, FR3, FR4, FR5, CEM1, CEM2, CEM3, CEM4 or CEM5 printed circuit board, for example, a through-contacted FR4 printed circuit board.

Figure 2:
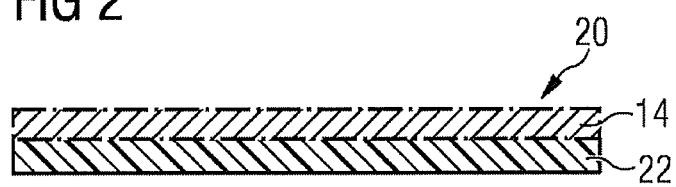
FIG. 2 shows a side view of one example of a housing arrangement.

FIG. 2 shows a side view of one example of a housing arrangement 20. The housing arrangement 20 can comprise a leadframe 22, for example, which can have a plurality of the leadframe sections 12, for example, which can be connected to one another via the leadframe and/or which can form the leadframe. The leadframe 22 can be coated with the molding material 14 and/or can be embedded into the molding material 14. The individual leadframe sections 12 and further details of the housing arrangement 20, of the molding material 14 and/or of the leadframe sections 12 are not illustrated, for the sake of simplified illustration.

Figure 3:
FIG. 3 shows a side view of one example of a housing arrangement.

FIG. 3 shows one example of the housing arrangement 20 in accordance with FIG. 2, wherein the housing arrangement 20 and/or the housings 10 are bent downward in the center thereof, which is explained in greater detail further below.

Figure 4:
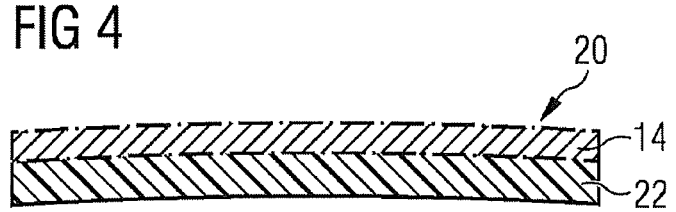
FIG. 4 shows a side view of one example of a housing arrangement.

FIG. 4 shows one example of the housing arrangement 20 in accordance with FIG. 2, wherein the housing arrangement 20 and/or the housings 10 are bent upwardly in the center thereof, which is explained in greater detail further below.

Figure 5:
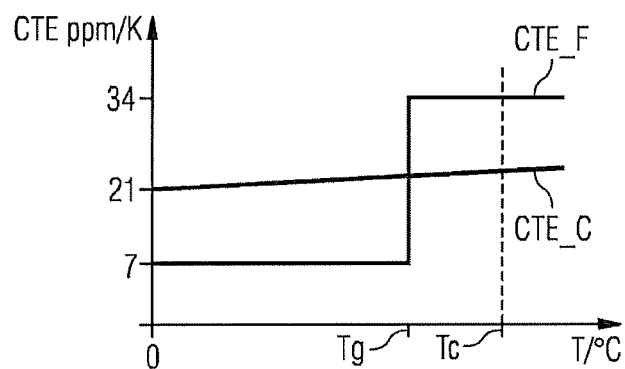
FIG. 5 shows a diagram with profiles of coefficients of thermal expansion as a function of the temperature.

FIG. 5 shows one example of a diagram in which, by way of example, a profile CTE_F of a coefficient of thermal expansion CTE of the material of the molding material 14 in ppm per kelvin and a profile CTE_C of the coefficient of thermal expansion CTE of the material of the leadframe 22 in ppm per kelvin are plotted as a function of the temperature T. The diagram reveals that the coefficient of thermal expansion CTE below a glass transition temperature Tg of the material of the molding material 14, for example, is below the coefficient of thermal expansion CTE of the material of the leadframe 22 and, above the glass transition temperature Tg, is above the coefficient of thermal expansion CTE of the material of the leadframe 22.

By way of example, the glass transition temperature Tg of the coefficient of thermal expansion CTE of the material of the molding material 14 is 135° C. A curing temperature Tc of the material of the molding material 14 can be 145° C., for example. Below the glass transition temperature Tg, the material of the molding material 14 is hard or solid. Above the glass transition temperature Tg, the solidity of the material of the molding material 14 changes abruptly, such that the latter is soft or viscous above the glass transition temperature Tg.

Consequently, the temperature-dictated material expansions of the material of the molding material 14 and of the material of the leadframe 22 deviate from one another to a greater or lesser extent depending on the temperature. By way of example, at high temperatures, the material of the leadframe 22 can expand to a greater extent than the material of the molding material 14 and, at low temperatures, the material of the molding material 14 can expand to a greater extent than the material of the leadframe 22. At different temperatures this leads to different effects in accordance with the known bimetal effect, even though the material of the molding material 14 can also be free of metal.

By way of example, a temperature of the example of the housing arrangement 20 as shown in FIG. 3 is approximately 135° C. which causes the housing arrangement 20 and/or the housings 10 to bend downwardly in the center thereof.

By way of example, a temperature of the example of the housing arrangement 20 as shown in FIG. 4 is, for example, less than 50° C., for example, less than 30° C., for example, approximately 25° C. which causes the housing arrangement 20 and/or the housings 10 to bend upwardly in the center thereof.

Figure 6:
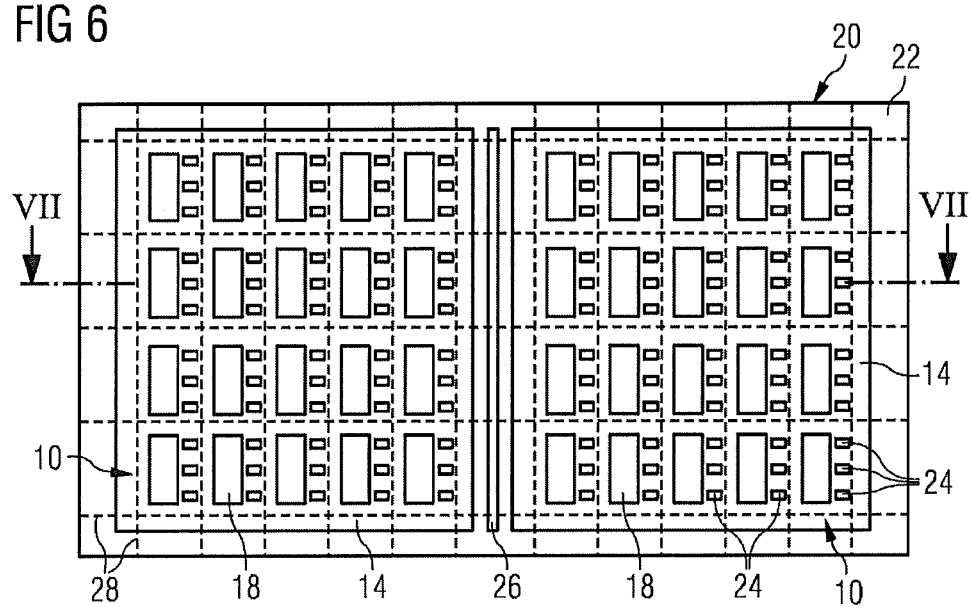
FIG. 6 shows a plan view of one example of a housing arrangement.
Figure 7:
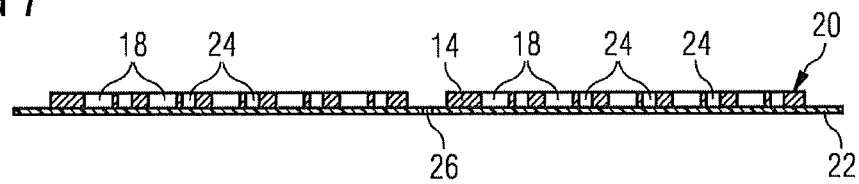
FIG. 7 shows a sectional illustration in side view of the housing arrangement in accordance with FIG. 6.

FIGS. 6 and 7 show one example of a housing arrangement 20 which can comprise a plurality of housings 10 having corresponding leadframe sections 12, for example, which can be connected to one another via the leadframe 22 and the molding material 14. In this case, FIG. 6 shows a plan view of the housing arrangement 20 and FIG. 7 shows a sectional view of the housing arrangement 20 along the sectional edge shown in FIG. 6.

The housings 10 can be formed substantially in a manner corresponding to the housing shown in FIG. 1. In addition to the housing 1 shown in FIG. 1, however, the housings 10 shown in FIG. 6 and/or the housing arrangement 20 to avoid the above-explained bending or to reduce the same, have a plurality of stress reduction openings 24 formed in the molding material 14.

By way of example, the stress reduction openings 24 can be distributed regularly over the individual housings 10. By way of example, there can be formed in the molding material 14 of the housings 10 in each case one, two, three or more stress reduction openings 24, for example, alongside a respective receiving region 18. Furthermore, the stress reduction openings 24 can be made smaller, larger or of the same size compared to the receiving region 18. By way of example, just one stress reduction opening 24 can be formed per housing 10, the stress reduction opening extending, for example, from a bottommost one of the stress reduction openings 24 of one of the housings 10 as shown in FIG. 6 as far as a topmost one of the shown stress reduction openings 24 of the same housing 10.

Bending can be further reduced or prevented, for example, by a region being formed in the center of the housing arrangement 20 in which region the leadframe 22 is free of molding material 14 and in which region, for example, one, two or more leadframe stress reduction openings 26 are formed.

Figure 8:
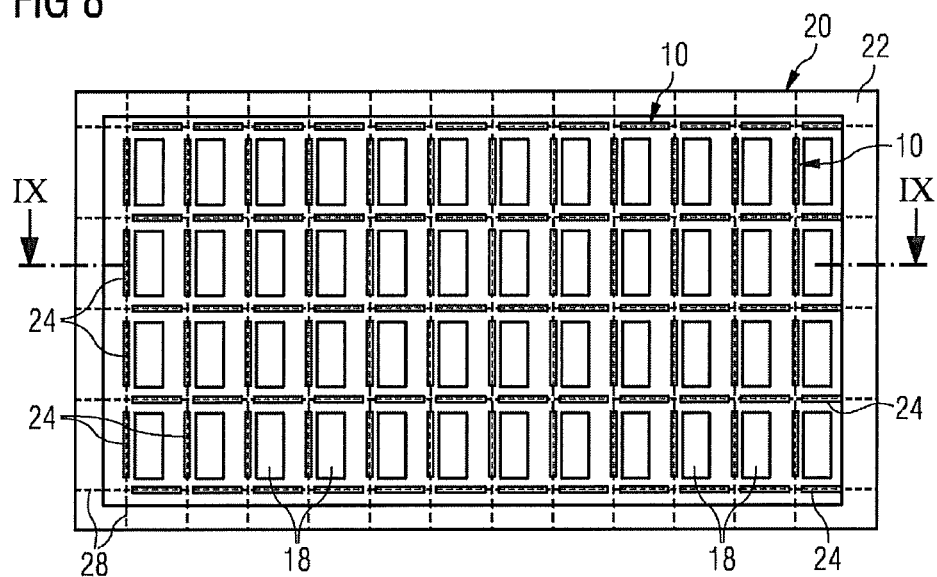
FIG. 8 shows a plan view of one example of a housing arrangement.
Figure 9:
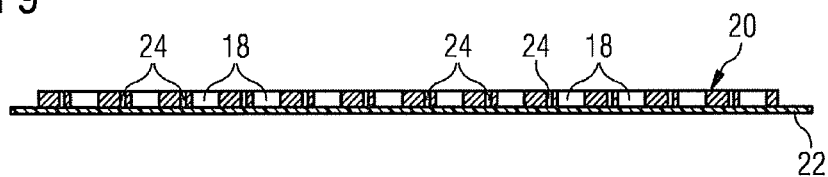
FIG. 9 shows a sectional illustration in side view of the housing arrangement in accordance with FIG. 8.

FIGS. 8 and 9 show a further example of a housing arrangement 20 which may substantially correspond to the example of the housing arrangement 20 explained with reference to FIGS. 6 and 7. In this case, FIG. 8 shows a plan view of the housing arrangement 20 and FIG. 9 shows a sectional view of the housing arrangement 20 along the sectional edge shown in FIG. 8.

As an alternative or in addition to the stress reduction openings 24 shown in FIGS. 6 and 7, the stress reduction openings 24 can be formed, for example, such that they are formed in the housing arrangement 20 in the molding material 14 at transitions from in each case one of the housings 10 to another of the housings 10. The transitions can also be boundaries of the housings 10. By way of example, the stress reduction openings 24 can be formed along separating lines 28 which are depicted in FIG. 8 and at which the housings 10 are subsequently singulated, for example, cut or sawed. This can contribute, for example, to simplifying the separating, for example, cutting or sawing, process since less material of the molding material 14 then has to be separated, in particular sawn or cut. This can contribute, for example, to the fact that a separating tool, for example, a saw blade is subject to less wear.

Figure 10:
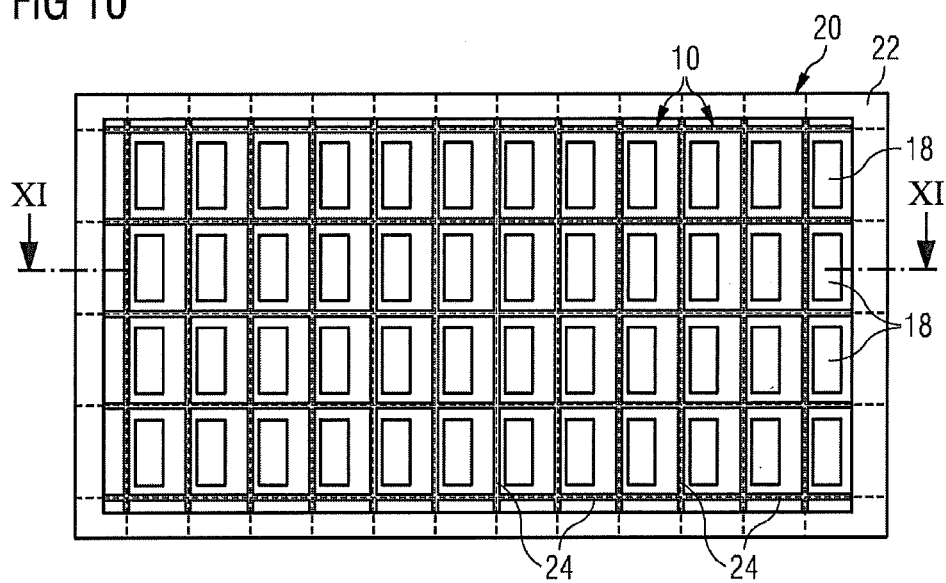
FIG. 10 shows a plan view of one example of a housing arrangement.
Figure 11:
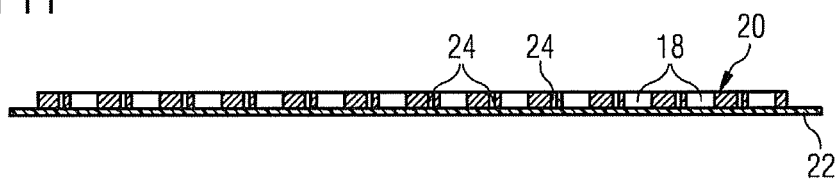
FIG. 11 shows a sectional illustration in side view of the housing arrangement in accordance with FIG. 10.

FIGS. 10 and 11 show a further example of a housing arrangement 20 which may substantially correspond to one of the above-explained examples of the housing arrangement 20. In this case, FIG. 10 shows a plan view of the housing arrangement 20 and FIG. 11 shows a sectional view of the housing arrangement 20 along the sectional edge shown in FIG. 10.

Alternatively or additionally, the stress reduction openings 24 can be formed continuously at the transitions from one housing 10 to another of the housings 10 such that with regard to the molding material 14, for example, the housings 10 are already separated from one another in the housing arrangement 20. This can contribute, for example, to simplifying the separating, for example, cutting or sawing, process since only the material of the leadframe 20 then has to be separated, and not the molding material 14. As an alternative thereto, the stress reduction openings 24 can also continuously extend only in one direction, for example, in accordance with FIG. 10, and can be interrupted in another direction, for example, perpendicularly thereto, for example, in accordance with FIG. 8. Furthermore, the stress reduction openings 24 at the transitions in accordance with FIG. 8 and/or FIG. 10 can be combined with the stress reduction openings 24 in accordance with FIG. 6.

Figure 12:
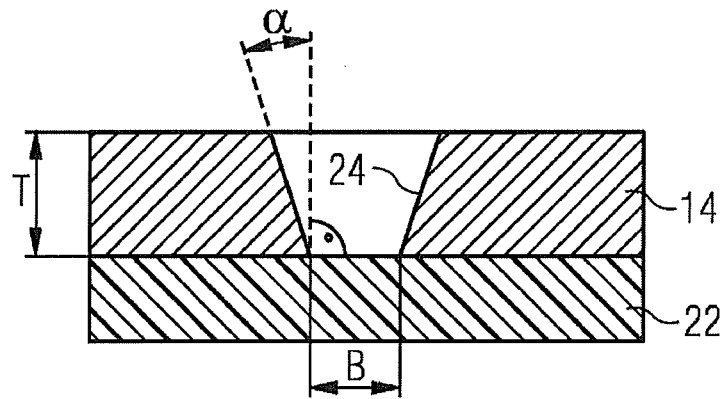
FIG. 12 shows a sectional detail view of one example of a stress reduction opening.

FIG. 12 shows a cross section through an example of a stress reduction opening 24, for example, one of the stress reduction openings 24 explained above. The stress reduction opening 24 can have, for example, a width B of 0.1 to 10.00 mm, for example, of 2 to 4 mm. Furthermore, the stress reduction opening 24 can have a depth T, for example, which can correspond, for example, to a thickness of the molding material 14 on the leadframe 12. In other words, the leadframe 12 can be exposed and/or free of molding material 14 in the stress reduction opening 24. Furthermore, sidewalls of the openings which form the stress reduction openings 24 can be, for example, at an angle $\alpha$ with respect to a perpendicular to a surface of the leadframe 22, which angle can be, for example, 1 to 20 degrees, for example, 5 to 15 degrees, for example, approximately 9 degrees.

Figure 13:
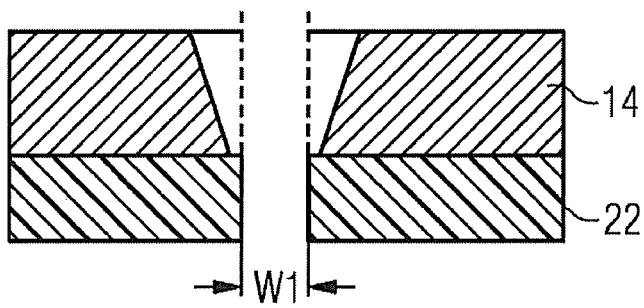
FIG. 13 shows a saw cut through one example of a stress reduction opening.

FIG. 13 shows the cross section shown in FIG. 12 of the example of the stress reduction opening 24 after the housings 10 have been singulated, for example, after the leadframe sections 12 have been separated from one another. The singulation and/or separation is carried out, for example, in a cutting or sawing process. In the sawing process, for example, it is possible to use a saw blade having a first width W1 which is, for example, less than the width B of the stress reduction opening 24. This has the effect that the oblique sidewalls of the stress reduction openings 24 are maintained at the edge in the subsequently singulated housings 10.

Figure 14:
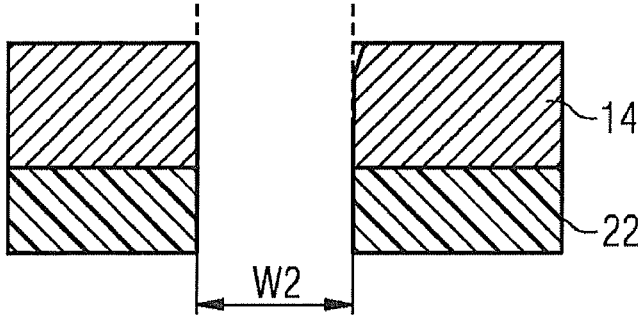
FIG. 14 shows a saw cut through one example of a stress reduction opening.

FIG. 14 shows the cross section shown in FIG. 12 of the example of the stress reduction opening 24 after the housings 10 have been singulated, for example, after the leadframe sections 12 have been separated from one another. The singulation and/or separation is carried out, for example, in a cutting or sawing process. In the sawing process, for example, it is possible to use a saw blade having a second width W2, which is almost of the same magnitude as, equal in magnitude to or greater than the width B of the stress reduction opening 24. This has the effect that the oblique sidewalls of the stress reduction openings 24 are only just barely evident or no longer evident at all at the edge in the subsequently singulated housings 10.

Figure 15:
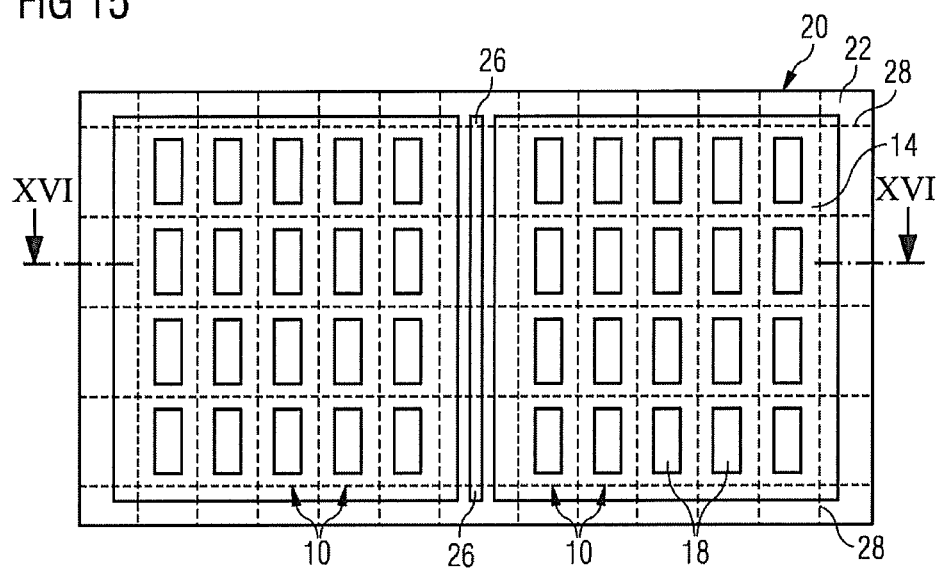
FIG. 15 shows a plan view of one example of a housing arrangement.
Figure 16:
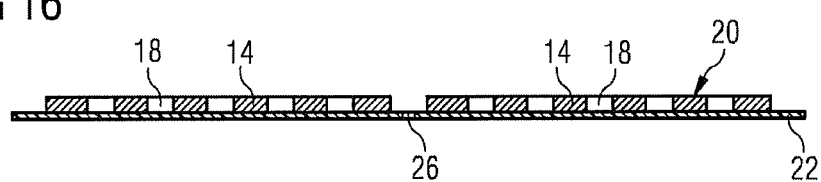
FIG. 16 shows a sectional illustration in side view of the housing arrangement in accordance with FIG. 14.

FIGS. 15 and 16 show a further example of a housing arrangement 20 which may substantially correspond to one of the above-explained examples of the housing arrangement 20. FIG. 15 shows a plan view of the housing arrangement 20 and FIG. 16 shows a sectional view of the housing arrangement 20 along the sectional edge shown in FIG. 15. The example of the housing arrangement 20 can comprise, for example, only leadframe stress reduction openings 26, for example, a leadframe stress reduction opening 26 in the leadframe 22. By way of example, the leadframe stress reduction opening 26 can be formed before the leadframe 22 is embedded into the molding material 14. The leadframe stress reduction openings 26 can be formed, for example, in a center of the leadframe 22. The leadframe stress reduction openings 26 can be formed, for example, along a center line which identifies a center of a long side of the leadframe 22 and which runs perpendicularly to the long side. The leadframe stress reduction openings 26 can extend, for example, through the entire thickness of the leadframe 22.

The examples above have been explained with reference to greatly simplified graphical illustrations in the corresponding figures to elucidate the fundamental principles.

Figure 17:
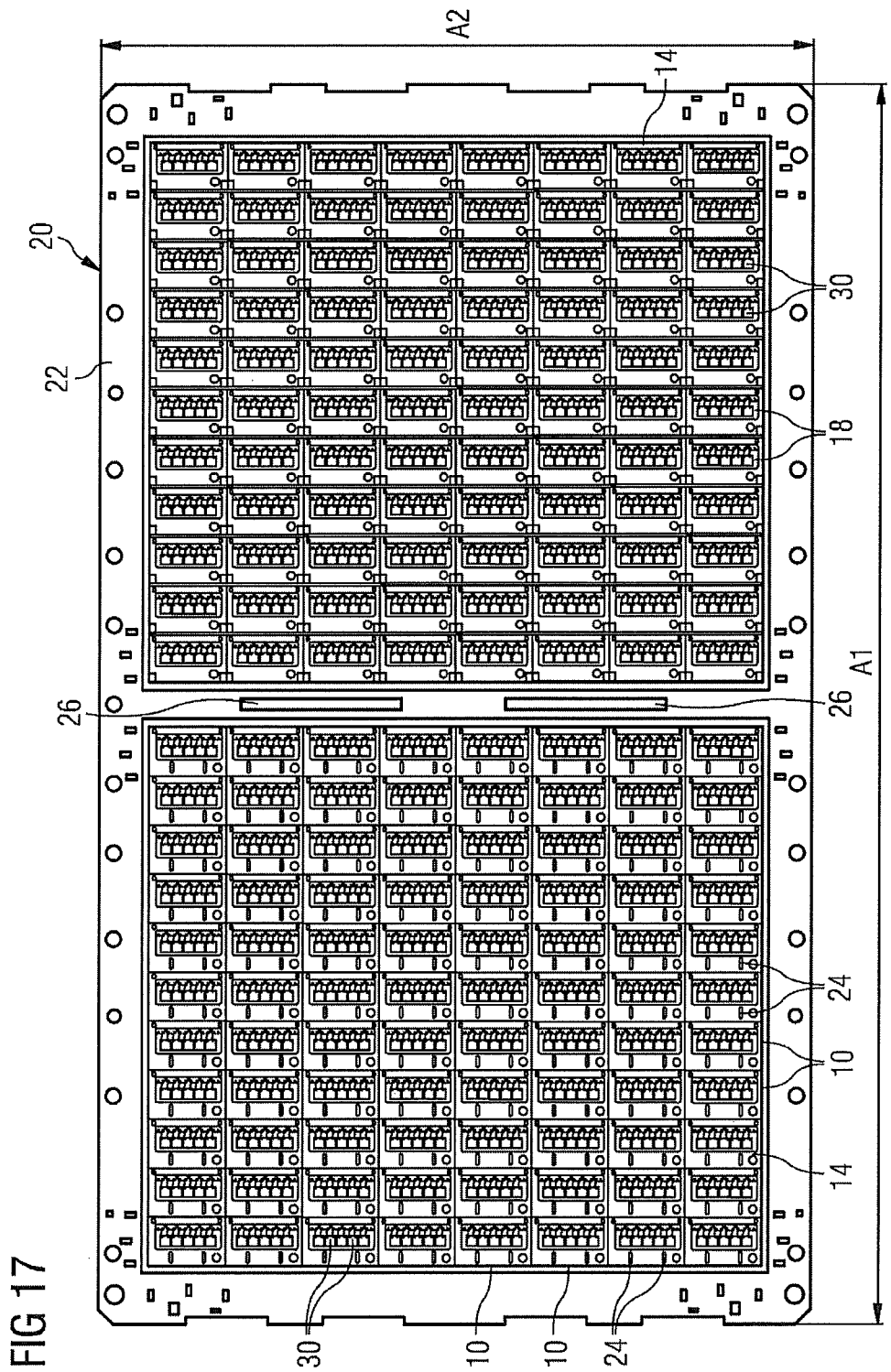
FIG. 17 shows a plan view of one example of a housing arrangement.

In contrast thereto, FIG. 17 shows one example of a housing arrangement 20 which may correspond in principle to one of the above-explained examples of the housing arrangement 20, wherein FIG. 17 shows the housing arrangement 20 such as can be formed in detail, for example.

In the receiving openings 18, electronic components 30 can be arranged in receiving regions, for example, and/or the electronic components 30 can be electrically contacted in the contact regions. In the leadframe 22, for example, one, two or more leadframe stress reduction openings 26 can be formed in the center, for example. For illustrations purposes, no stress reduction openings 24 are formed on the right-hand section of the molding material 14 in FIG. 17, and the stress reduction openings 24 in the housings 10 are formed in the left-hand section.

If the stress reduction openings 24 and/or the leadframe stress reduction openings 26 of this example or of the examples explained above extend in an elongate direction, then this direction can be chosen, for example, such that it is perpendicular to a possible bending direction. By way of example, the housing arrangement 20 has a long side A1 and a short side A2, wherein the short side A2 is, for example, perpendicular to the long side A1. The risk of bending exists in this case, for example, in the direction of the long side A1 such that no or only negligible bending takes place, for example, along the short side A2. In this case, for example, the stress reduction openings 24 and/or the leadframe stress reduction openings 26 of this example or of the examples explained above can be formed perpendicular to the long side A1 and/or parallel to the short side A2.

Figure 18:
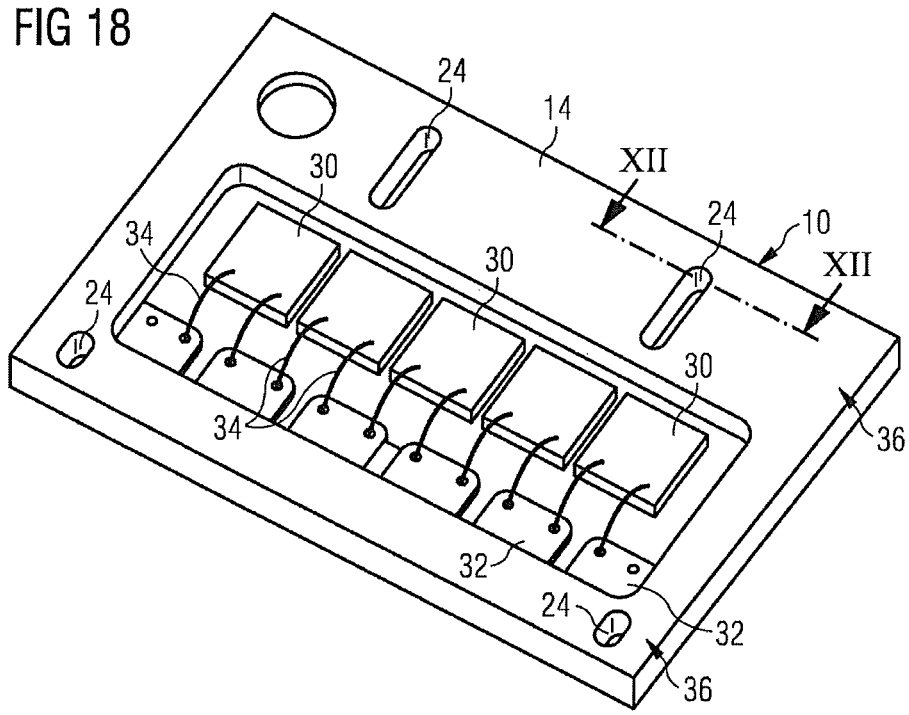
FIG. 18 shows a perspective view of one example of an electronic assembly.

FIG. 18 shows an electronic assembly comprising a housing, for example, one of the housings 10 explained above and, for example, a plurality of electronic components 30, for example, five thereof. However, the electronic assembly can also comprise more or fewer electronic components 30. The electronic components 30 can comprise components that emit electromagnetic radiation, for example. The electronic components 30 can be electrically connected, for example, with the aid of bonding connections 34 to contact regions 32 of the leadframe section 12. The housing 10 can have two stress reduction openings 24, for example, at two of its corners and/or parallel to the receiving region 18. As an alternative thereto, however, more or just one stress reduction opening 24 can be formed.

Figure 19:
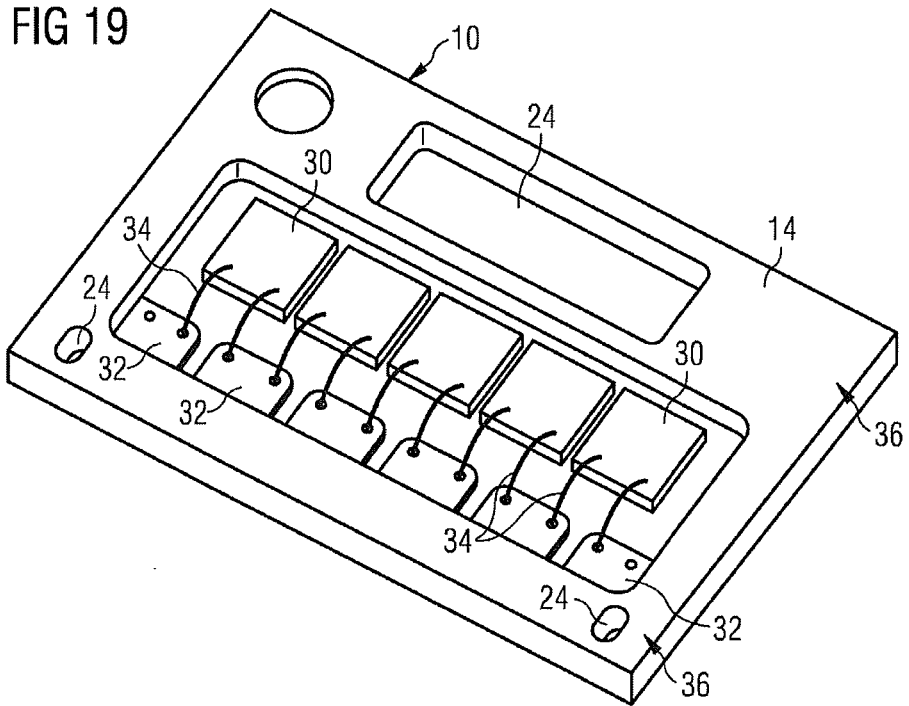
FIG. 19 shows a perspective view of one example of an electronic assembly.

FIG. 19 shows one example of an electronic assembly which may, for example, substantially correspond to the example of the electronic assembly explained with reference to FIG. 18, wherein the electronic assembly can comprise stress reduction openings 24, for example, only at two of its corners and/or a large stress reduction opening 24 parallel to the receiving region 18.

In the examples in accordance with FIGS. 18 and 19, the stress reduction openings 24 can be formed, for example, in free regions 36 which, for example, extend parallel to a long sidewall of the housing and extend parallel to a surface of the leadframe section 12 and which are free of receiving regions and contact regions. In other words, the stress reduction openings 24 can be formed precisely in the free regions 36 in which otherwise the molding material 14 would extend over a relatively large region. This can contribute particularly effectively to preventing or reducing bending of the housing arrangement 22 and/or of the housings 10.

FIG. 20 shows a flow diagram of one example of a method of producing a housing for an electronic component, for example, producing one of the housings 10 explained above. The method serves to produce the housing 10 without or at least with only little warping and/or to reduce or prevent warping of the housing arrangement 20 during the production process.

A step S2 involves providing a leadframe, for example, one of the leadframes 22 explained above. The leadframe 22 can have a plurality of leadframe sections 12. By way of example, as leadframe blank a copper plate can be provided in which the leadframe sections 12 can be formed, for example, by one or two etching processes.

In a step S4, optionally one, two or more of the leadframe stress reduction openings 26 can be formed in the leadframe 22. Steps S2 and S4 can be carried out simultaneously, for example. In other words, the leadframe stress reduction openings 26 can be formed in the same etching process as the leadframe sections 12. As an alternative thereto, the leadframe stress reduction openings 26 can also be formed in a subsequent process, for example, an etching process or a cutting or sawing process.

In a step S6, the leadframe 22 can be embedded into the molding material 14. For this purpose, the leadframe 22 can be arranged, for example, in a molding tool to form the molding material 14, 16. The molding tool can have, for example, a top molding body (top mold) and a bottom molding body (bottom mold). At least one of the molding bodies, for example, the top molding body has a plurality of prominences which form the receiving openings 18 and/or the stress reduction openings 24 during formation of the molding material 14. In the closed molding tool, the prominences project, for example, as far as the leadframe such that the latter remains free of molding material in the regions in which the prominences are arranged. The molding tool can be closed and liquefied molding material can be supplied to the molding tool. The molding material can be supplied, for example, at a temperature of 150° C. to 190° C., for example, at approximately 175° C. The molding material can be injected or poured in, for example. In the molding tool, the molding material settles around the prominences and on and below the leadframe 22. Subsequently, the housing arrangement 20 can be cured in the molding tool or can be removed from the molding tool and then cured. By way of example, the housing arrangement 20 can be allowed to cool or can be cooled, for example, to a temperature of less than 135° C., for example, to approximately 25° C.

On account of the stress reduction openings 24, bending of the housing arrangement 20 is substantially reduced and/or prevented such that afterward the further processing of the housing arrangement 20 can be carried out simply and effectively. By way of example, the at least substantially flat housing arrangement 20 can simply be sucked up, transported on a conveyor belt, populated with the electronic components 30 and/or singulated.

In a step S8, the housing 10 can be singulated from the housing arrangement 20. By way of example, the housing arrangement 20 can be cut or sawed, as a result of which the individual housings 10 can be separated from one another. Each individual one of the housings 10 can be designated as a QFN housing, for example.

The housing 10 can be produced with the aid of steps S2 to S8. In other words, the method for producing the housing 10 can be ended after the processing of step S8.

As an alternative thereto, a step S10 can additionally also be carried out, in which one, two or more electronic components 30 are arranged in the housing 10 and contacted. The housing 10 together with the electronic components 30 can be designated, for example, as an electronic assembly and/or as a QFN package. Step S10 can be carried out, for example, before or after step S8, that is to say, for example, before or after the singulation. Step S10 can also be designated as populating the housing 10. Steps S2 to S10 can also be designated as a method for producing an electronic assembly. The electronic components 30 arranged in the receiving opening 18 can, for example, be encapsulated with an encapsulation material and/or be embedded into the encapsulation material, for example, with and/or into silicone or into silicone comprising a convertor for converting electromagnetic radiation or comprising $TiO_2$, wherein the encapsulation material can be covered, for example, partly or wholly with a black epoxy. The encapsulation and/or embedding of the electronic components 30 can be carried out, for example, before or after the singulation of the housings 10.

Our arrangements and methods are not restricted to the examples indicated. By way of example, the individual examples can be combined with one another. By way of example, the stress reduction openings shown in FIGS. 6 to 16 can be formed in arbitrary combination jointly at a housing arrangement 20 and/or a housing 10. By way of example the stress reduction openings 24 can be formed in the free regions 36 and the transition regions. Furthermore, the stress reduction openings 24 can be formed in part continuously and in part individually.

The invention claimed is:

1. A housing arrangement comprising a plurality of interconnected housings for electronic components, each housing comprising:

a leadframe section of a leadframe, wherein the leadframe section is formed from an electrically conductive material and has a receiving region that receives the electronic component and/or a contact region that contacts the electronic component, a molding material into which the leadframe section is embedded and which has at least one receiving opening in which the receiving region and/or the contact region are exposed, at least one stress reduction opening formed in the molding material and separate from the receiving region and/or the contact region, wherein the housings connect to one another via the leadframe and the molding material, the at least one stress reduction opening being formed at transitions from in each case one of the housings to another of the housings, and a leadframe stress reduction opening formed in the leadframe in a region free of molding material.

2. The housing arrangement as claimed in claim 1, wherein the stress reduction opening is formed with a depth such that the material of the leadframe section is exposed in the stress reduction opening.

3. The housing arrangement as claimed in claim 1, wherein the stress reduction opening has a groove in the molding material.

4. The housing arrangement as claimed in claim 1, wherein no receiving opening is formed in a free region which extends in the molding material along a direction parallel to a surface of the leadframe section and parallel to a lateral outer wall of the housing, and the stress reduction opening is formed in the free region.

5. A method of producing a housing for an electronic component, wherein a leadframe section is provided, which is formed from an electrically conductive material and which has a receiving region that receives the electronic component and/or a contact region that contacts the electronic component, wherein the leadframe section is provided in an arrangement with further leadframe sections as a leadframe, the leadframe section is embedded into a molding material, whereby a housing arrangement is formed, wherein at least one receiving opening in which the receiving region and/or the contact region are/is exposed is formed in the molding material for each leadframe section, at least one stress reduction opening separate from the receiving region and/or the contact region is formed in the molding material for each leadframe section, wherein the stress reduction openings are formed at transitions from one of the leadframe sections to another of the leadframe sections, a plurality of housings are singulated from the housing arrangement by the embedded leadframe sections being separated from one another, and a leadframe stress reduction opening formed in the leadframe in a region free of molding material.

6. The method as claimed in claim 5, wherein the stress reduction opening is formed with a depth such that the material of the leadframe section is exposed in the stress reduction opening.

7. The method as claimed in claim 5, wherein a free region is formed in the molding material, which free region extends in the molding material along a direction parallel to a surface of the leadframe section and parallel to a lateral outer wall of the housing and in which free region no receiving opening is formed, and the stress reduction opening is formed in the free region.

8. The method as claimed in claim 5, wherein the leadframe has a long side and a short side parallel to its surface, and the stress reduction openings are formed perpendicularly to the long side and/or parallel to the short side.

9. A method of producing an electronic assembly, wherein a housing is formed as claimed in claim 5 and the electronic component is arranged and/or contacted in the receiving opening before or after the housings are singulated from the housing arrangement.

10. A method of producing a housing for an electronic component, wherein a leadframe section is provided, which is formed from an electrically conductive material and which has a receiving region that receives the electronic component and/or a contact region that contacts the electronic component, wherein the leadframe section is provided in an arrangement with further leadframe sections as a leadframe, the leadframe section is embedded into a molding material by the leadframe being embedded into the molding material, whereby a housing arrangement is formed, wherein at least one receiving opening in which the receiving region and/or the contact region are/is exposed is formed in the molding material for each leadframe section, at least one stress reduction opening free of the receiving region and/or the contact region is formed in the molding material for each leadframe section, wherein the stress reduction openings are formed at transitions from one of the leadframe sections to another of the leadframe sections, a plurality of housings are singulated from the housing arrangement by the embedded leadframe sections being separated from one another, and by the individual housings being separated in the region of at least some of the stress reduction openings, and a leadframe stress reduction opening is formed in the leadframe in a region free of molding material.

* * * * *